(12) United States Patent
Moon et al.

(10) Patent No.: US 8,987,757 B2
(45) Date of Patent: *Mar. 24, 2015

(54) LIGHT EMITTING DEVICE AND LIGHTING SYSTEM HAVING THE SAME

(75) Inventors: Yong Tae Moon, Seoul (KR); Dae Seob Han, Seoul (KR); Jeong Sik Lee, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 81 days.

This patent is subject to a terminal disclaimer.

(21) Appl. No.: 13/288,193

(22) Filed: Nov. 3, 2011

(65) Prior Publication Data

US 2012/0043526 A1   Feb. 23, 2012

(30) Foreign Application Priority Data

Nov. 17, 2010   (KR) .................. 10-2010-0114334

(51) Int. Cl.
| | |
|---|---|
| *H01L 33/00* | (2010.01) |
| *H01L 33/06* | (2010.01) |
| *H01L 33/04* | (2010.01) |
| *H01L 33/32* | (2010.01) |
| *H01L 33/12* | (2010.01) |

(52) U.S. Cl.
CPC ................ *H01L 33/06* (2013.01); *H01L 33/04* (2013.01); *H01L 33/32* (2013.01); *H01L 33/12* (2013.01)
USPC ............ 257/86; 257/76; 257/78; 257/E33.01; 257/E31.036

(58) Field of Classification Search
USPC ....... 257/13, 15, 76, 78, 86, E33.01, E31.036
See application file for complete search history.

(56) References Cited

U.S. PATENT DOCUMENTS

| | | | |
|---|---|---|---|
| 5,561,679 A | 10/1996 | Mannik et al. | |
| 6,078,602 A | 6/2000 | Sato | |
| 2003/0197188 A1* | 10/2003 | Watatani et al. | 257/88 |
| 2004/0051107 A1* | 3/2004 | Nagahama et al. | 257/79 |
| 2007/0045655 A1* | 3/2007 | Song et al. | 257/104 |
| 2007/0081313 A1* | 4/2007 | Tanaka et al. | 361/767 |

(Continued)

FOREIGN PATENT DOCUMENTS

| | | |
|---|---|---|
| DE | 10 2006-046237 | 1/2008 |
| DE | 10 2009-015569 | 10/2010 |

(Continued)

OTHER PUBLICATIONS

European Search Report for Application 11187776.7 dated Dec. 2, 2013.

*Primary Examiner* — Su C Kim
(74) *Attorney, Agent, or Firm* — KED & Associates LLP

(57) ABSTRACT

Disclosed are a light emitting device and a lighting system having the same. The light emitting device includes a first conductivity-type semiconductor layer, an interfacial layer including at least two superlattice structures adjacent to the first conductivity-type semiconductor layer, an active layer adjacent to the interfacial layer, and a second conductivity-type semiconductor layer adjacent to the active layer. The first conductivity-type semiconductor layer, interfacial layer, active layer, and second conductivity-type semiconductor layer are stacked in a same direction, the first and second semiconductor layer are of different conductivity types, an energy band gap of the superlattice structure adjacent to the active layer is smaller than an energy band gap of the superlattice structure adjacent to the first conductivity-type semiconductor layer.

18 Claims, 15 Drawing Sheets

(56) References Cited

U.S. PATENT DOCUMENTS

2008/0023689 A1* 1/2008 Kim et al. .................. 257/13
2008/0023690 A1* 1/2008 Moon ........................ 257/13
2012/0033444 A1* 2/2012 Moon et al. ................ 362/606

FOREIGN PATENT DOCUMENTS

EP          1 063 711       12/2000
KR        2008-0045943       5/2008

* cited by examiner

ELECTRON INJECTION LAYER — HOLE INJECTION LAYER

FIRST SUPERLATTICE STRUCTURE   SECOND SUPERLATTICE STRUCTURE   THIRD SUPERLATTICE STRUCTURE   QUANTUM WELL   QUANTUM WALL

Ec
Ev

ELECTRON INJECTION LAYER — HOLE INJECTION LAYER

QUANTUM WELL   QUANTUM WALL

Ec
Ev

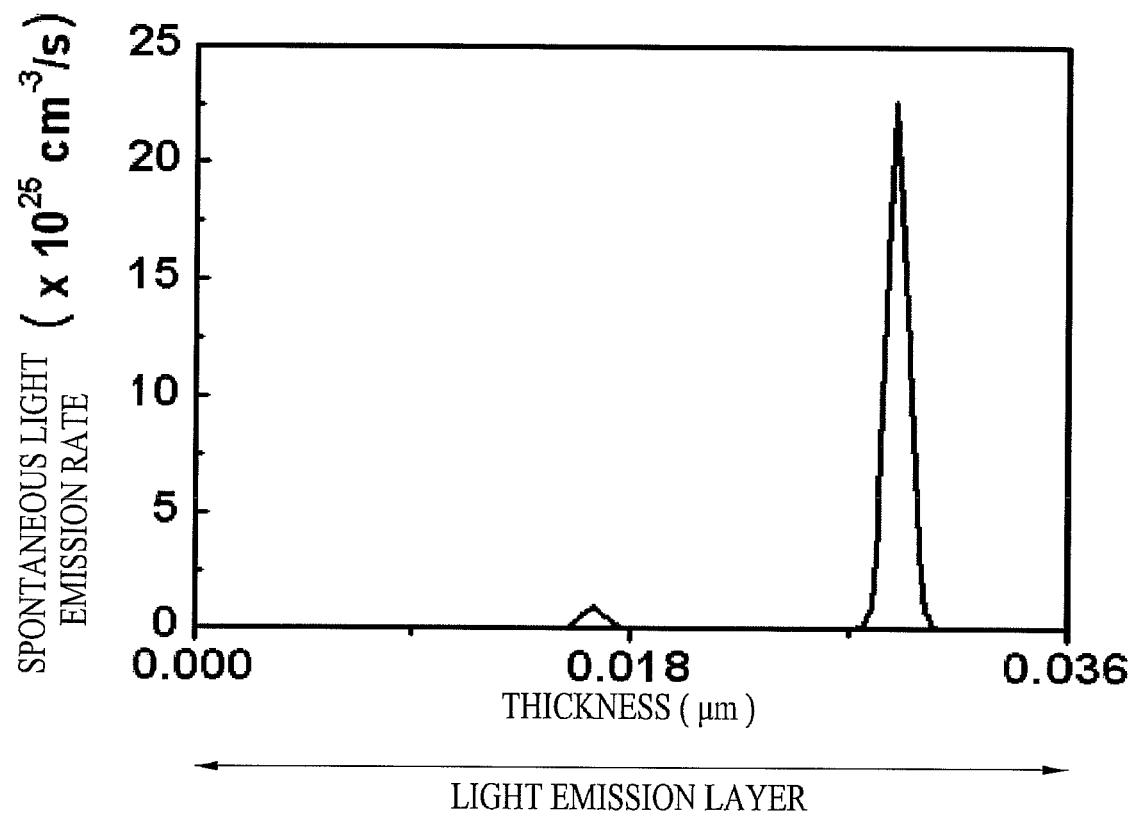

ELECTRON INJECTION LAYER | FIRST SUPERLATTICE STRUCTURE | SECOND SUPERLATTICE STRUCTURE | THIRD SUPERLATTICE STRUCTURE | QUANTUM WELL QUANTUM WALL

ELECTRON INJECTION LAYER | FIRST SUPERLATTICE STRUCTURE | SECOND SUPERLATTICE STRUCTURE | THIRD SUPERLATTICE STRUCTURE | QUANTUM WELL QUANTUM WALL

LIGHT EMITTING DEVICE AND LIGHTING SYSTEM HAVING THE SAME

CROSS REFERENCE TO RELATED APPLICATION

This application claims priority under 35 U.S.C. §119 to Korean Patent Application No 10-2010-0114334, filed in Korea on Nov. 17, 2010, which is hereby incorporated in its entirety by reference as if fully set forth herein.

TECHNICAL FIELD

Embodiments relate to a light emitting device and a lighting system having the same.

BACKGROUND

Light emitting devices, such as light emitting diodes or laser diodes using group III-V or II-VI compound semiconductor materials, implement light of various colors, such as red, green, blue, and ultraviolet light, due to development of thin film growth techniques and device materials, and implement white light using fluorescent materials or through color mixing. Further, the light emitting devices have advantages, such as low power consumption, semi-permanent life-span, rapid response speed, stability, and environmental friendliness as compared to conventional light sources, such as fluorescent lamps and incandescent lamps.

Therefore, these light emitting devices are increasingly applied to transmission modules of optical communication units, light emitting diode backlights substituting for cold cathode fluorescent lamps (CCFLs) constituting backlights of liquid crystal display (LCD) devices, lighting apparatuses using white light emitting diodes substituting for fluorescent lamps or incandescent lamps, head lights for vehicles and traffic lights.

SUMMARY

Embodiments provide a light emitting device in which luminous efficiency is improved and a lighting system having the same.

In one embodiment, a light emitting device comprising a first conductivity-type semiconductor layer, an interfacial layer including at least two superlattice structures adjacent to the first conductivity-type semiconductor layer, an active layer adjacent to the interfacial layer and a second conductivity-type semiconductor layer adjacent to the active layer, wherein the first conductivity-type semiconductor layer, interfacial layer, active layer, and second conductivity-type semiconductor layer are stacked in a same direction, the first and second semiconductor layer are of different conductivity types, an energy band gap of the superlattice structure adjacent to the active layer is smaller than an energy band gap of the superlattice structure adjacent to the first conductivity-type semiconductor layer. The energy band gaps of the superlattice structures may be decreased in a direction toward the active layer.

An energy band gap of a quantum wall forming the boundary between the superlattice structures may be decreased stepwise.

The interfacial layer may include two to ten superlattice structures.

An energy band gap of a quantum wall forming the boundary between the superlattice structures may be decreased at an inclination in the direction toward the active layer.

An energy band gap of a layer having the greatest energy band gap in each of the superlattice structures may be smaller than an energy band gap of a quantum wall between the superlattice structures.

The energy band gap of the superlattice structure adjacent to the first conductivity-type semiconductor layer may be smaller than or equal to an energy band gap of the first conductivity-type semiconductor layer.

The energy band gap of the superlattice structure adjacent to the active layer may be greater than or equal to an energy band gap of the active layer.

The first conductivity-type semiconductor layer may be an N-type semiconductor layer, and the second conductivity-type semiconductor layer may be a P-type semiconductor layer.

In another embodiment, a light emitting device comprising a first conductivity-type semiconductor layer, an interfacial layer including at least two superlattice structures adjacent to the first conductivity-type semiconductor layer, an active layer adjacent to the interfacial layer, and a second conductivity-type semiconductor layer adjacent to the active layer, wherein the first conductivity-type semiconductor layer, interfacial layer, active layer, and second conductivity-type semiconductor layer are stacked in a same direction, the first and second semiconductor layer are of different conductivity types, an In (indium) content of the superlattice structure adjacent to the active layer is greater than an In content of the superlattice structure adjacent to the first conductivity-type semiconductor layer. The In contents of the superlattice structures may be increased in a direction toward the active layer.

In each of the superlattice structures, a first layer and a second layer having different In contents may be repeated at least twice.

The superlattice structure may have a composition formula of $Al_xIn_yGa_{1-x-y}N$ (here, $0 \leq x, y \leq 1$).

An In content of a quantum wall forming the boundary between the superlattice structures may be increased stepwise.

An In content of a quantum wall forming the boundary between the superlattice structures may be increased at an inclination in the direction toward the active layer.

An In content of a layer having the smallest In content in each of the superlattice structures may be greater than an In content gap of a quantum wall between the superlattice structures.

The In content of the superlattice structure adjacent to the first conductivity-type semiconductor layer may be greater than or equal to an In content of the first conductivity-type semiconductor layer.

The In content of the superlattice structure adjacent to the active layer may be smaller than or equal to an In content of the active layer.

In a further embodiment, a lighting system comprising light emitting device packages, each of which includes a package body, a first lead frame and a second lead frame disposed on the package body, and a light emitting device electrically connected to the first lead frame and the second lead frame and a circuit board to supply current to the light emitting device packages, wherein the light emitting device includes a first conductivity-type semiconductor layer, an interfacial layer including at least two superlattice structures adjacent to the first conductivity-type semiconductor layer, an active layer adjacent to the interfacial layer, and a second conductivity-type semiconductor layer adjacent to the active layer, wherein the first conductivity-type semiconductor layer, interfacial layer, active layer, and second conductivity-type semiconductor layer are stacked in a same direction, the first and second semiconductor layer are of different conductivity types, an energy band gap of the superlattice structure adjacent to the active layer is smaller than an energy band gap of the superlattice structure adjacent to the first conductivity-type semiconductor layer.

BRIEF DESCRIPTION OF THE DRAWINGS

Arrangements and embodiments may be described in detail with reference to the following drawings in which like reference numerals refer to like elements and wherein:

FIGS. 7A and 7B are graphs illustrating spontaneous light emission rates in the active layers of the light emitting device in accordance with the embodiment and the conventional light emitting device;

DESCRIPTION OF SPECIFIC EMBODIMENTS

Figure 1A:
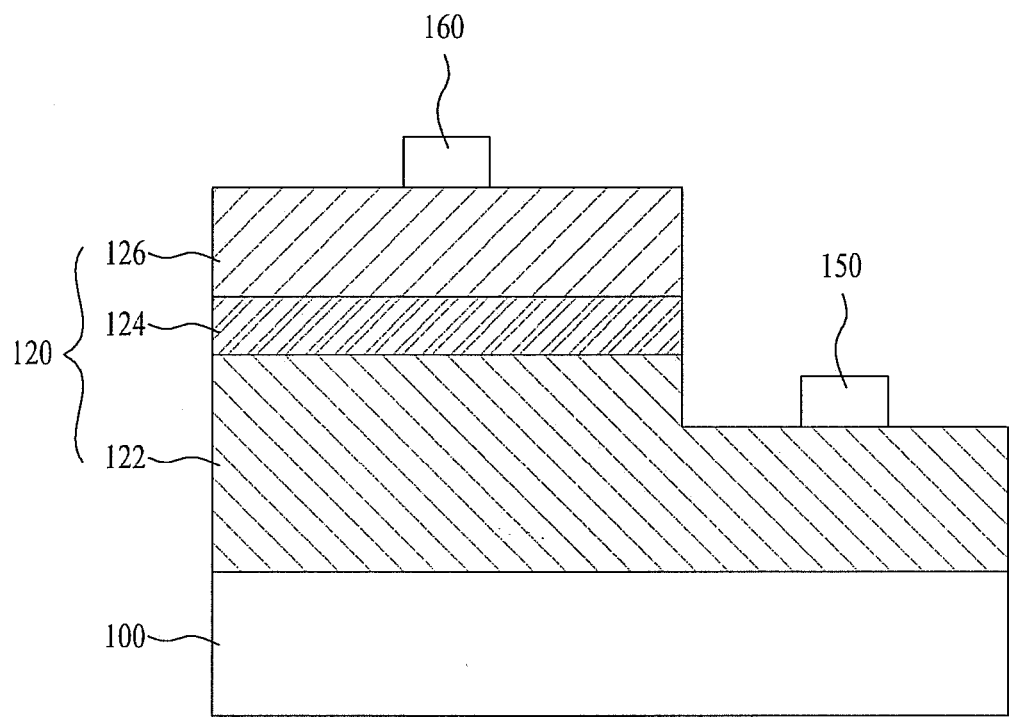
FIGS. 1A and 1B are sectional views of light emitting devices in accordance with embodiments.

Hereinafter, embodiments will be described with reference to the annexed drawings.

It will be understood that when one element, such as a layer (film), a region, a pattern or a structure, is referred to as being 'on' or "under" another element, such as a substrate, a layer (film), a region, a pad or a pattern, it can be directly on/under the element, and one or more intervening elements may also be present. When an element is referred to as being 'on' or 'under', 'under the element' as well as 'on the element' can be included based on the element.

In the drawings, the thicknesses or sizes of respective layers are exaggerated, omitted, or schematically illustrated for convenience and clarity of description. Further, the sizes of the respective elements do not denote the actual sizes thereof.

Figure 1B:
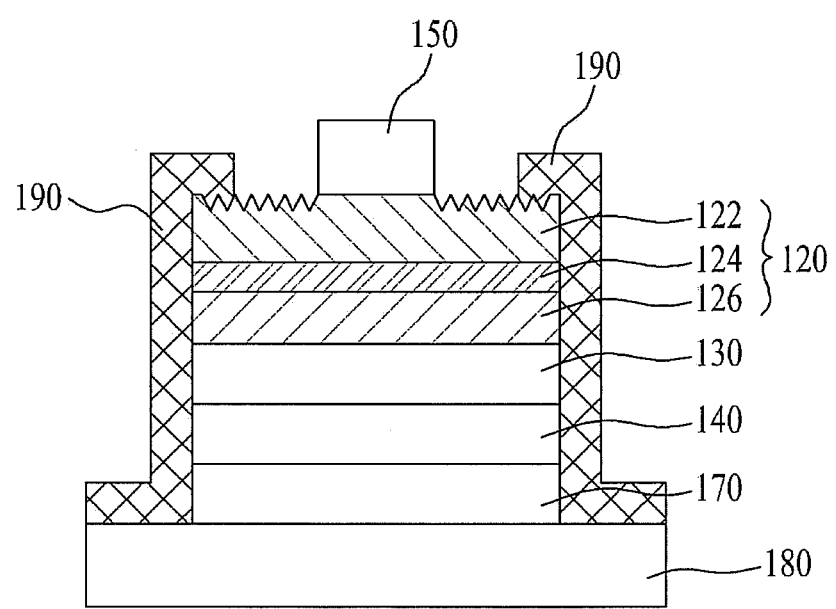
Figure 2:
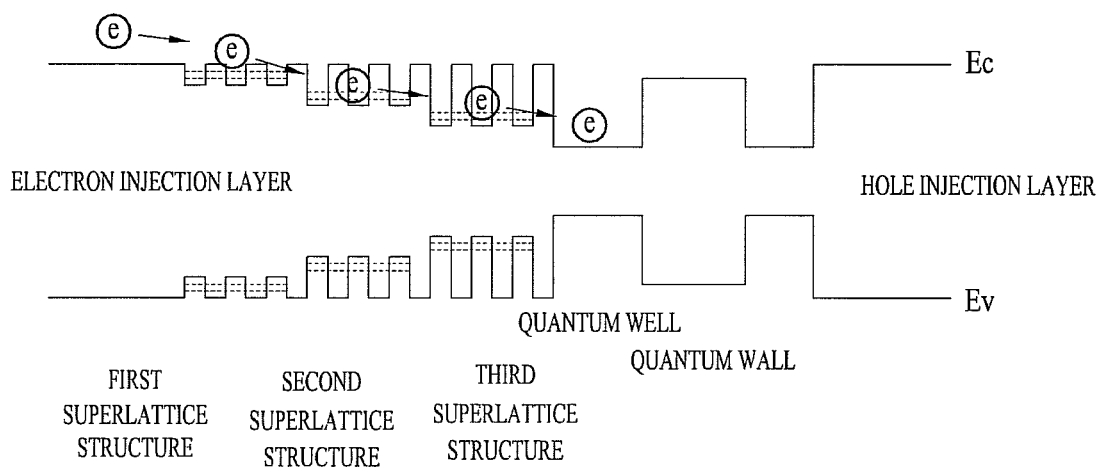
FIG. 2 is a view illustrating an energy band gap of a light emitting device in accordance with one embodiment.

FIGS. 1A and 1B are sectional views of light emitting devices in accordance with embodiments. FIG. 1A illustrates a horizontal type light emitting device and FIG. 1B illustrates a vertical type light emitting device. FIG. 2 is a view illustrating an energy band gap of a light emitting device in accordance with one embodiment.

In these embodiments or other embodiments, the light emitting device may be semiconductor light emitting device, for example light emitting diode.

With reference to FIG. 1A, a light emitting device in accordance with one embodiment includes a substrate 100, and a light emitting structure 120 disposed on the substrate 100 and including a first conductivity-type semiconductor layer 122 provided with an opened surface, an active layer 124 and a second conductivity-type semiconductor layer 126.

The substrate 100 may include a light transmitting material, for example, sapphire ($Al_2O_3$), GaN, SiC, ZnO, Si, GaP, InP, $Ga_2O_3$ or GaAs. Unevenness may be formed on the upper surface of the substrate 100.

A buffer layer (not shown) is disposed between such a nitride semiconductor and the substrate 100 to reduce lattice mismatch and a difference of thermal expansion coefficients between materials. As the buffer layer (not shown), a low temperature-grown GaN layer or AlN layer may be used.

The first conductivity-type semiconductor layer 122 may be provided alone or be further provided with an undoped semiconductor layer disposed thereunder, but the structure of the first conductivity-type semiconductor layer 122 is not limited thereto.

For example, the first conductivity-type semiconductor layer 122 may be an N-type semiconductor layer, and the N-type semiconductor layer may include a semiconductor material having a composition formula of $In_xAl_yGa_{1-x-y}N$ ($0 \leq x \leq 1$, $0 \leq y \leq 1$, $0 \leq x+y \leq 1$), for example, one selected from among the group consisting of GaN, AlN, AlGaN, InGaN, InN, InAlGaN, AlInN, etc. and be doped with an N-type dopant, such as Si, Ge, Sn, Se, Te, etc.

The undoped semiconductor layer is disposed to improve crystallinity of the first conductivity-type semiconductor layer 122. The undoped semiconductor layer may be equal to the first conductivity-type semiconductor layer except that the undoped semiconductor layer is not doped with an N-type dopant and thus has lower electrical conductivity than the first conductivity-type semiconductor layer 122.

The active layer 124 may be disposed on the first conductivity-type semiconductor layer 122. For example, the active layer 124 may include a semiconductor material having a composition formula of $In_xAl_yGa_{1-x-y}N$ ($0 \leq x \leq 1$, $0 \leq y \leq 1$, $0 \leq x+y \leq 1$), and include at least one selected from among the group consisting of a quantum wire structure, a quantum dot structure, a single quantum well structure and a multi quantum well (MQW) structure.

The active layer 124 may generate light by energy generated during recombination of electrons and holes supplied from the first conductivity-type semiconductor layer 122 and the second conductivity-type semiconductor layer 126.

The second conductivity-type semiconductor layer 126 may be disposed on the active layer 124. For example, the second conductivity-type semiconductor layer 126 may be a P-type semiconductor layer, and the P-type semiconductor layer may include a semiconductor material having a composition formula of $In_xAl_yGa_{1-x-y}N$ ($0 \leq x \leq 1$, $0 \leq y \leq 1$, $0 \leq x+y \leq 1$), for example, one selected from among the group consisting of GaN, AlN, AlGaN, InGaN, InN, InAlGaN, AlInN, etc. and be doped with a P-type dopant, such as Mg, Zn, Ca, Sr, Ba, etc.

Here, differently from the above description, the first conductivity-type semiconductor layer 122 may be a P-type semiconductor layer and the second conductivity-type semiconductor 126 may be an N-type semiconductor layer. Further, a third conductivity-type semiconductor layer (not shown) which is an N-type or P-type semiconductor layer may be disposed on the first conductivity-type semiconductor layer 122. Thereby, the light emitting device in accordance with this embodiment may include at least one selected from among the group consisting of np, pn, npn and pnp junction structures.

Further, doping concentrations of the dopants in the first conductivity-type semiconductor layer 122 and the second conductivity-type semiconductor layer 126 may be uniform or non-uniform. That is, structures of the plural semiconductor layers may be various, but are not limited to the above description.

A first electrode 150 is disposed on the opened surface of the first conductivity-type semiconductor layer 122, and a second electrode 160 is disposed on the second conductivity-type semiconductor layer 126. Here, the first electrode 150 and the second electrode 160 may respectively have a single-layer structure or a multi-layer structure including at least one selected from among the group consisting of aluminum (Al), titanium (Ti), chrome (Cr), nickel (Ni), copper (Cu) and gold (Au).

The horizontal light emitting device shown in FIG. 1A is etched using MESA etching from the second conductivity-type semiconductor layer 126 to a portion of the first conductivity-type semiconductor layer 122, and is provided with the first electrode 150 disposed on the exposed surface of the first conductivity-type semiconductor layer 122. The vertical light emitting device shown in FIG. 1B is provided with an Ohmic layer 130 and a reflective layer 140 disposed on the second conductivity-type semiconductor layer 126.

The Ohmic layer 130 may include at least one selected from among the group consisting of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IZO nitride (IZON), Al—Ga ZnO (AGZO), In—Ga ZnO (IGZO), ZnO, IrOx, RuOx, NiO, RuOx/ITO, Ni/IrOx/Au, Ni/IrOx/Au/ITO, Ag, Ni, Cr, Ti, Al, Rh, Pd, Ir, Ru, Mg, Zn, Pt, Au and Hf, but is not limited thereto.

The reflective layer 140 may be disposed on the Ohmic layer 130. The reflective layer 140 may be formed in a single-layer structure or a multi-layer structure including at least one selected from among the group consisting of Ag, Ni, Al, Rh, Pd, Ir, Ru, Mg, Zn, Pt, Au, Hf and alloys thereof.

Aluminum or silver effectively reflects light generated from the active layer 140, thereby being capable of highly improving light extraction efficiency of the light emitting device.

A conductive support member 180 may be disposed on the reflective layer 140. The conductive support member 180 may selectively include copper (Cu), gold (Au), a copper alloy, nickel (Ni), Cu—W and carrier wafers (for example, GaN, Si, Ge, GaAs, ZnO, SiGe, SiC, $Ga_2O_3$, etc.). The conductive support member 180 may be formed through electrochemical metal deposition method or a bonding method using a eutectic metal.

A connection layer 170 is disposed between the conductive support member 180 and the reflective layer 140. The connection layer 170 may include a barrier metal or a bonding metal, for example, at least one selected from among the group consisting of Ti, Au, Sn, Ni, Cr, Ga, In, Bi, Cu, Ag and Ta, but is not limited thereto. The connection layer 170 may be formed by bonding different connection layers, but is not limited thereto.

Unevenness may be disposed on the surface of the first conductivity-type semiconductor layer 122. The Unevenness on the surface of the first conductivity-type semiconductor layer 122 may be formed by executing an etching process using a photo enhanced chemical etching (PEC) method or a mask pattern. Such unevenness serve to increase external extraction efficiency of light generated from the active layer 124, and may have a regular or irregular cycle.

In the light emitting device in accordance with the embodiment, a plurality of superlattice structures having different energy band gaps is provided to be close to the active layer 124 in order of energy band gap sizes, thereby cooling electrons injected into the active layer 124 to lower an energy state of the electrons. With reference to FIG. 2, the above-described light emitting device is provided with an interfacial layer between the first conductivity-type semiconductor layer 122 and the active layer 124.

The first conductivity-type semiconductor layer 122 may be an N-type semiconductor layer and function as an electron injection layer, and the second conductivity-type semiconductor layer 126 may be a P-type semiconductor layer and function as a hole injection layer. Here, the first conductivity-type semiconductor layer 122 and the second conductivity-type semiconductor layer 126 have been described above with reference to FIGS. 1A and 1B.

The interfacial layer includes at least two superlattice structures. Although FIG. 2 illustrates the interfacial layer as including three superlattice structures, the interfacial layer may include ten or less superlattice structures. In each superlattice structure, two layers (first and second layers) having different energy band gaps are repeated at least twice, and FIG. 2 illustrates the first and second layers as being repeated three times. The above two layers having different energy band gaps form the superlattice structure. In the superlattice structure, two layers (first and second layers) having different In contents may be repeated at least twice.

The superlattice structure includes a nitride semiconductor layer having the above-described composition, and an energy band gap thereof may be changed by varying an In content thereof. The superlattice structure has a composition formula of $Al_xIn_yGa_{1-x-y}N$ ($0 \le x \le 1$, $0 \le y \le 1$, $0 \le x+y \le 1$), and the content of In may be varied, as described above. Further, a quantum wall is provided between neighboring superlattice structures. Here, the quantum wall has a thickness of 0.5~30 nm.

In the case of the horizontal light emitting device shown in FIG. 1A, the energy band gaps of the superlattice structures are decreased in a direction from the first conductivity-type semiconductor layer (i.e., the electron injection layer) 122 toward the active layer 124. The respective layers (first and second layers) of the superlattice structures may have a thickness of 0.5~20 nm. In each of the respective superlattice structures (first to third superlattice structures), two nitride semiconductor layers having different energy band gaps, i.e., the first layer and the second layer, may be repeated two to forty times.

The above-described change of the energy band gaps may be formed by increasing In contents in the interfacial layer in the direction from the first conductivity-type semiconductor layer toward the active layer. That is, the In content in the second superlattice structure may be greater than the In content in the first superlattice structure, and the In content in the third superlattice structure may be greater than the In content in the second superlattice structure.

The energy band gap of the superlattice structure adjacent to the first conductivity-type semiconductor layer, i.e., the first superlattice structure in FIG. 2, may be smaller than or equal to the energy band gap of the first conductivity-type semiconductor layer (the electron injection layer), and electrons may easily progress in the direction from the first conductivity-type semiconductor layer toward the superlattice structure. The In content of the superlattice structure adjacent to the first conductivity-type semiconductor layer (the electron injection layer) may be greater than or equal to the In content of the first conductivity-type semiconductor layer.

The energy band gap of the superlattice structure adjacent to the active layer (the quantum well) layer, i.e., the third superlattice structure in FIG. 2, may be greater than or equal to the energy band gap of the active layer, and electrons may easily progress in the direction from the superlattice structure to the active layer. Here, the In content of the superlattice structure adjacent to the active layer may be smaller than or equal to the In content of the active layer.

When electrons are injected into the above-described light emitting device from the electron injection layer, the electrons are first injected into the first superlattice structure having a lower energy state than the electron injection layer (the first conductivity-type semiconductor layer). That is, in the case of the embodiments shown in FIGS. 1A and 1B, when electrons are injected into the light emitting device from the first conductivity-type semiconductor layer 122, the electrons are injected into the first superlattice structure prior to injection into the active layer 124.

The electrons injected into the first superlattice structure pass through the first superlattice structure and are then injected into the second superlattice structure having a lower energy state. The electrons injected into the second superlattice structure lose energy corresponding to an energy state difference between the first superlattice structure and the second superlattice structure, thus being cooled.

Thereafter, the electrons, the energy state of which is quantum-mechanically lowered while passing through the second superlattice structure, are injected into the third superlattice structure having a lower energy state. Here, injected electrons having a sufficiently low energy state which are sufficiently cooled while passing through the third superlattice structure adjacent to the active layer having a multi quantum well structure are quantum-mechanically injected into quantum wells in the active layer.

Here, since the energy state of the third superlattice structure may be equal or similar to the energy state of the quantum wells and the electrons injected into the quantum wells are sufficiently cooled in terms of energy, there is a very low probability that the electrons quantum-mechanically invade the hole injection layer over the quantum wells in the active layer.

Therefore, the interfacial layer of the light emitting device in accordance with the embodiment cools electrons having a high energy state injected from the electron injection layer and effectively injects the electrons into the active layer, thereby removing an amount of electrons leaking to the hole injection layer and thus improving luminous efficiency of the light emitting device. Further, the interfacial layer improves a horizontal distribution function and a compression stress relaxation function, thereby improving luminous efficiency of a large-area and high-output device operated in a high injection current area.

Figure 3:
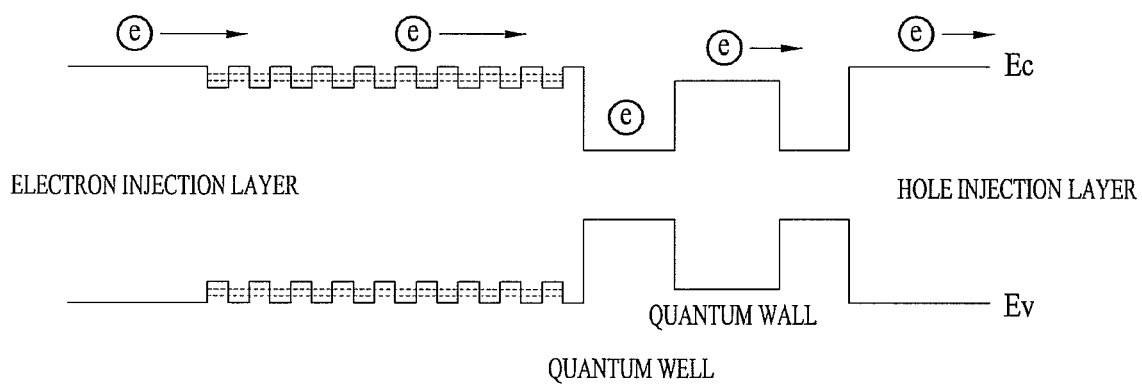
FIG. 3 is a view illustrating an energy band gap of a conventional light emitting device.

FIG. 3 is a view illustrating an energy band gap of a conventional light emitting device.

In the conventional light emitting device, a superlattice structure is provided between an electron injection layer and an active layer, and the superlattice structure is formed by alternately repeating two layers having different energy band gaps. Such a superlattice structure may effectively distribute injection current in a layer having a low energy band gap, horizontally.

Here, the superlattice structure formed by repeatedly stacking the two layers having different energy band gaps has an energy mini band in quantum mechanics. Since the energy band gap of such a mini band is sufficiently greater than the energy band gap of quantum wells, electrons injected into the quantum wells through the mini band have sufficiently high energy, and thus may pass through the quantum wells and leak to the hole injection layer.

Figure 4:
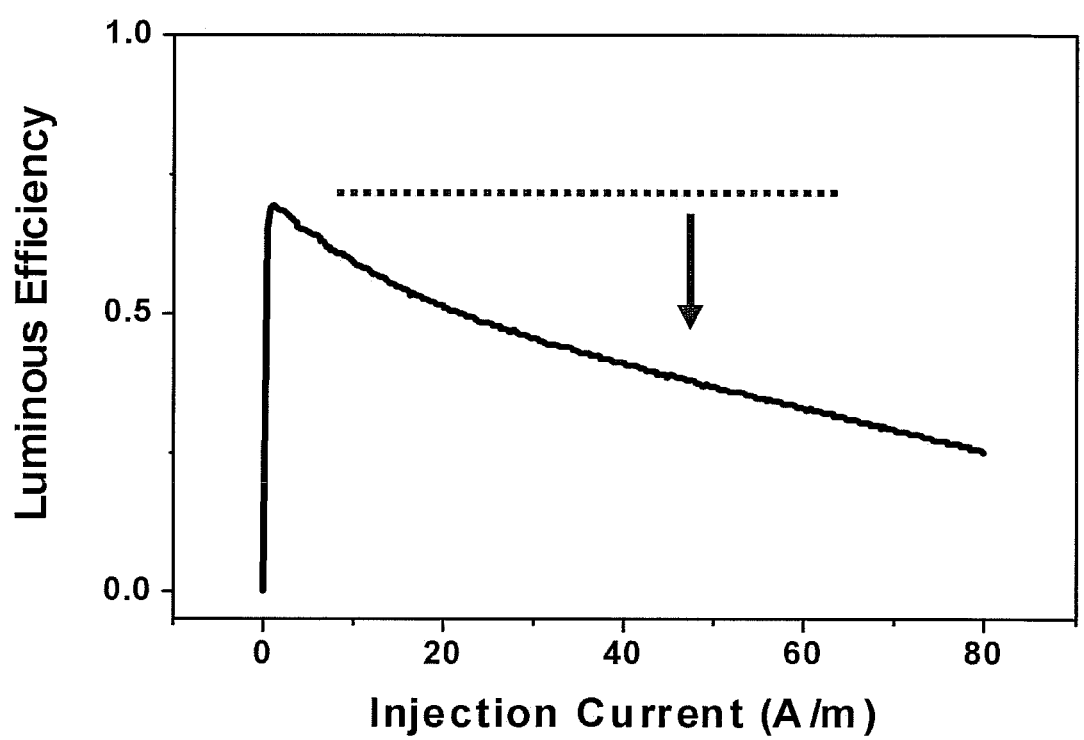
FIG. 4 is a graph illustrating luminous efficiency of the light emitting device shown in FIG. 3 according to injection current.

Such leakage of the injected electrons may cause lowering of luminous efficiency according to increase in injection current, as shown in FIG. 4.

Therefore, it is necessary to sufficiently cool the electrons injected into the quantum wells to lower the energy state of the electrons. The light emitting device having the interfacial layer shown in FIG. 2 effectively cools the injected electrons having a high energy state through plural superlattice structures to reduce leakage of the injected electrons to the hole injection layer, thereby improving luminous efficiency of a high-output device operated in a high injection current area and improving the horizontal distribution function and the compression stress relaxation function.

Figure 5A:
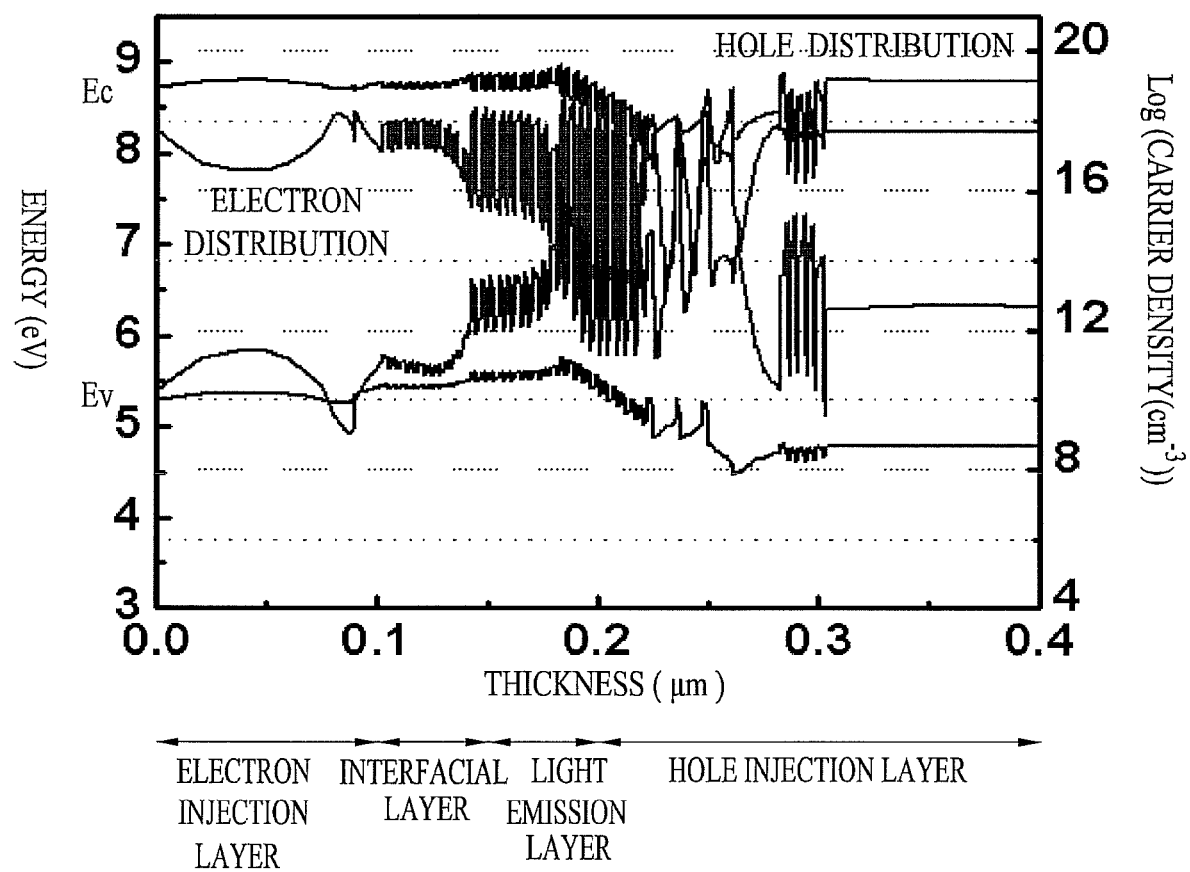
FIGS. 5A and 5B are graphs illustrating distribution of electrons and holes in light emitting structures of the light emitting device in accordance with the embodiment and the conventional light emitting device.
Figure 5B:
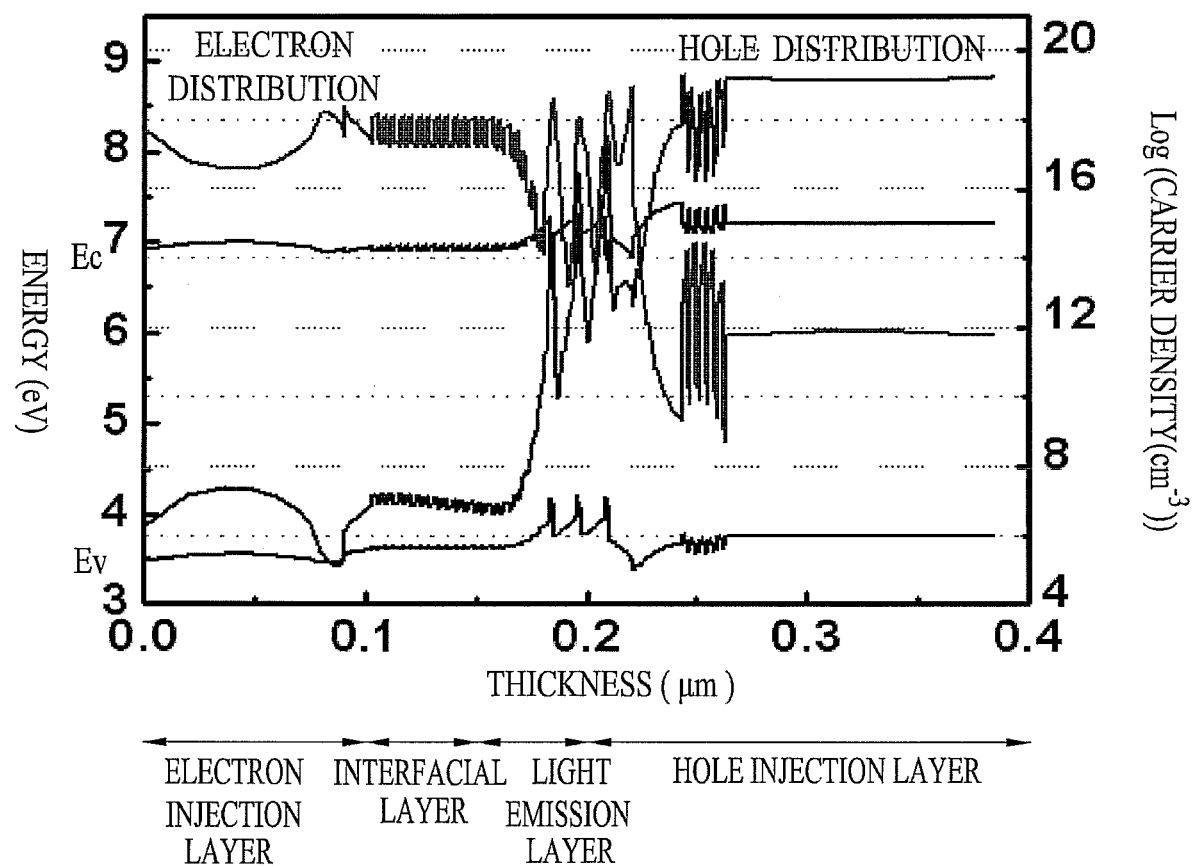

FIGS. 5A and 5B are graphs illustrating distribution of electrons and holes in light emitting structures of the light emitting device in accordance with the embodiment and the conventional light emitting device.

In the light emitting device in accordance with the embodiment, as shown in FIG. 5A, the active layer includes 3 quantum walls/quantum wells having an $In_{0.15}GaN/GaN$ structure, and the quantum walls and the quantum wells respectively have a thickness of 3 nm and a thickness of 10 nm. The interfacial layer includes the first superlattice structure including 10 first/second layers having an $n-In_{0.03}GaN/n-GaN$ structure, the second superlattice structure including 10 first/second layers having an $n-In_{0.06}GaN/n-GaN$ structure, and the third superlattice structure including 10 first/second layers having an $n-In_{0.10}GaN/GaN$ structure, and the respective layers have a thickness of 2 nm.

In the conventional light emitting device, as shown in FIG. 5B, the superlattice structure includes 20 pairs of first/second layers having an $n-In_{0.03}GaN/n-GaN$ structure, and the respective layers have a thickness of 2 nm. Further, the active layer includes 3 quantum walls/quantum wells having an $In_{0.15}GaN/GaN$ structure, and the quantum walls and the quantum wells respectively have a thickness of 3 nm and a thickness of 10 nm.

The light emitting device in accordance with this embodiment has uniform distribution of electrons and holes in the active layer, thereby expecting improvement in luminous efficiency.

Figure 6A:
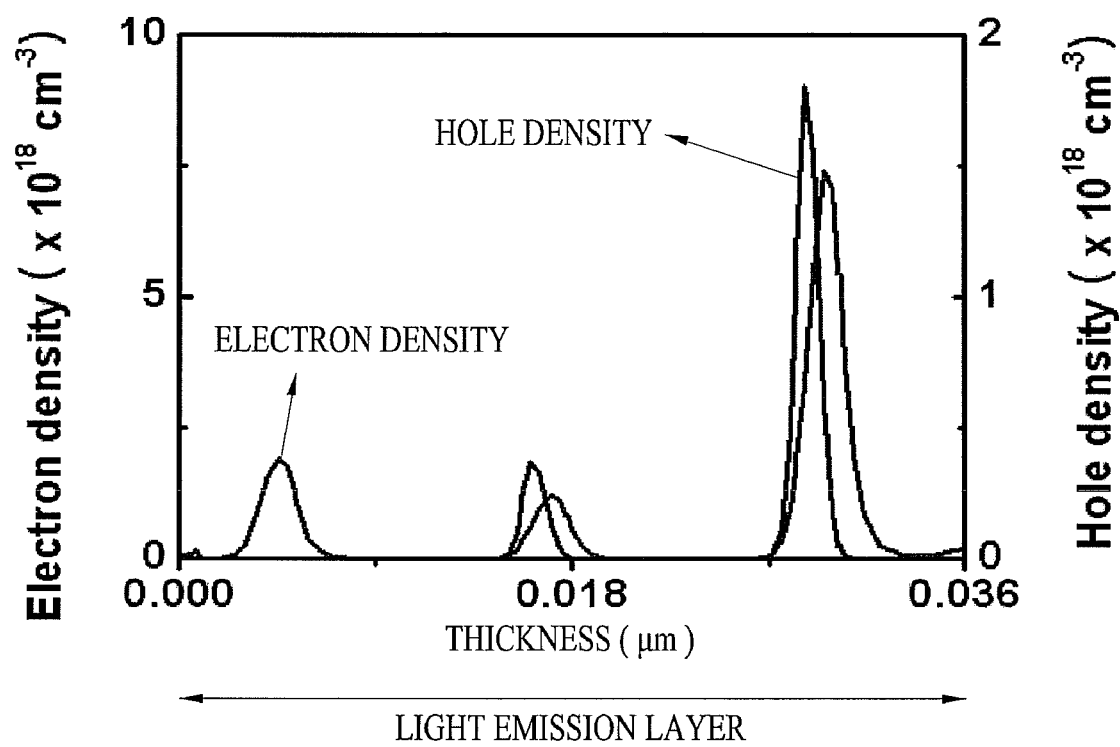
FIGS. 6A and 6B are graphs illustrating distribution of electrons and holes in active layers of the light emitting device in accordance with the embodiment and the conventional light emitting device.
Figure 6B:
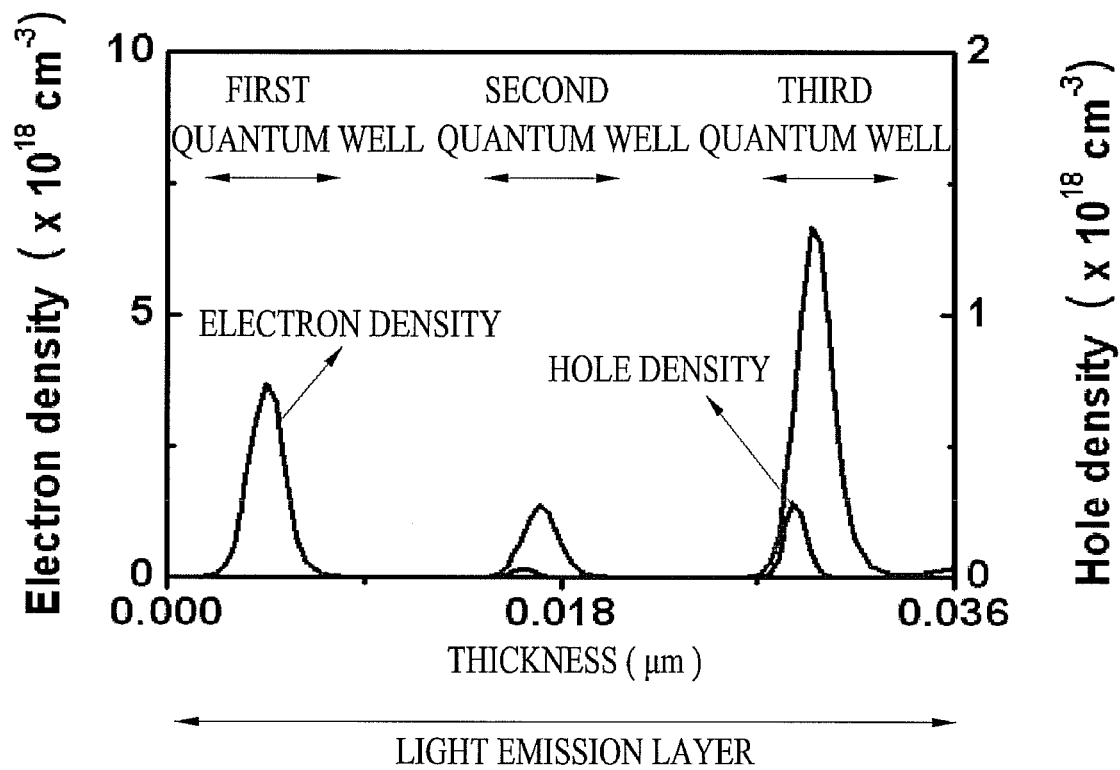

FIGS. 6A and 6B are graphs illustrating distribution of electrons and holes in the active layers of the light emitting device in accordance with the embodiment and the conventional light emitting device.

In the conventional light emitting device, as shown in FIG. 6B, a hole density is much lower than an electron density in three quantum wells. On the other hand, in the light emitting device in accordance with the embodiment, as shown in FIG. 6A, both electrons and holes are uniformly distributed in three quantum wells.

Figure 7B:
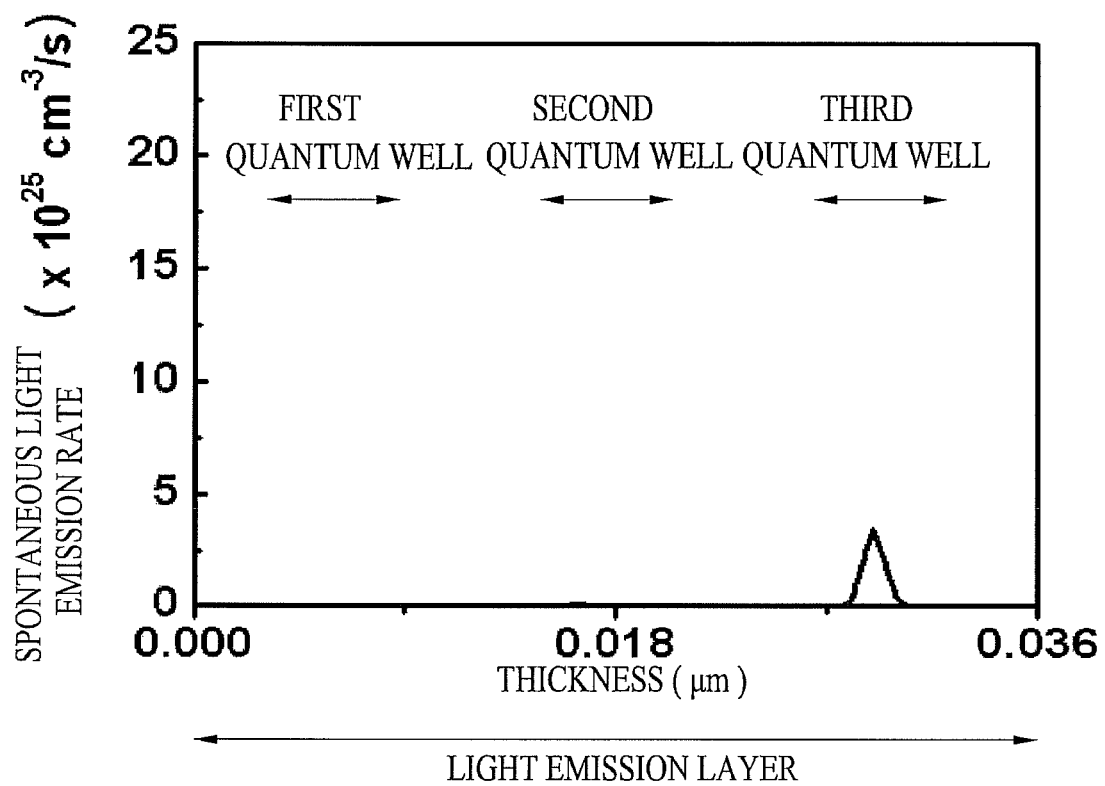

FIGS. 7A and 7B are graphs illustrating spontaneous light emission rates in the active layers of the light emitting device in accordance with the embodiment and the conventional light emitting device. It is understood that the light emission rate of the light emitting device in accordance with the embodiment, particularly, the light emission rate at the second and third quantum wells is improved.

Figure 8:
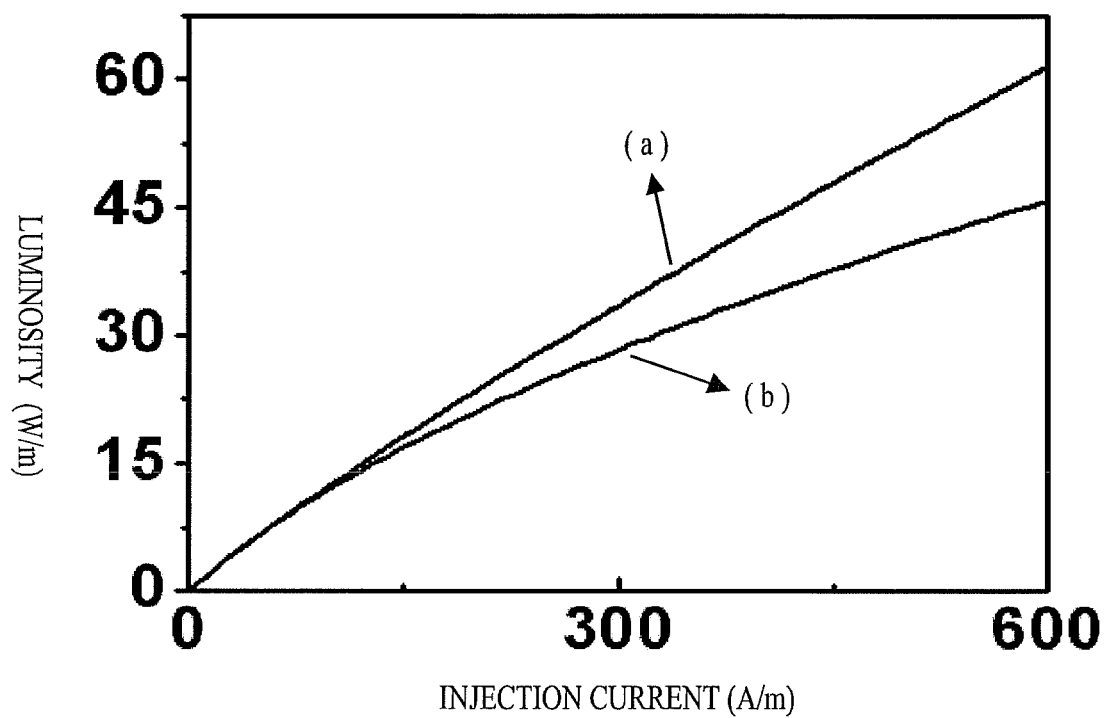
FIG. 8 is a graph illustrating luminosities of the light emitting device in accordance with the embodiment and the conventional light emitting device according to injection current.

FIG. 8 is a graph illustrating luminosities of the light emitting device in accordance with the embodiment and the conventional light emitting device according to injection current. It is understood that luminosity of the light emitting device in accordance with the embodiment is improved by 35% at injection current of 600 A/m as compared to the conventional light emitting device.

Figure 9:
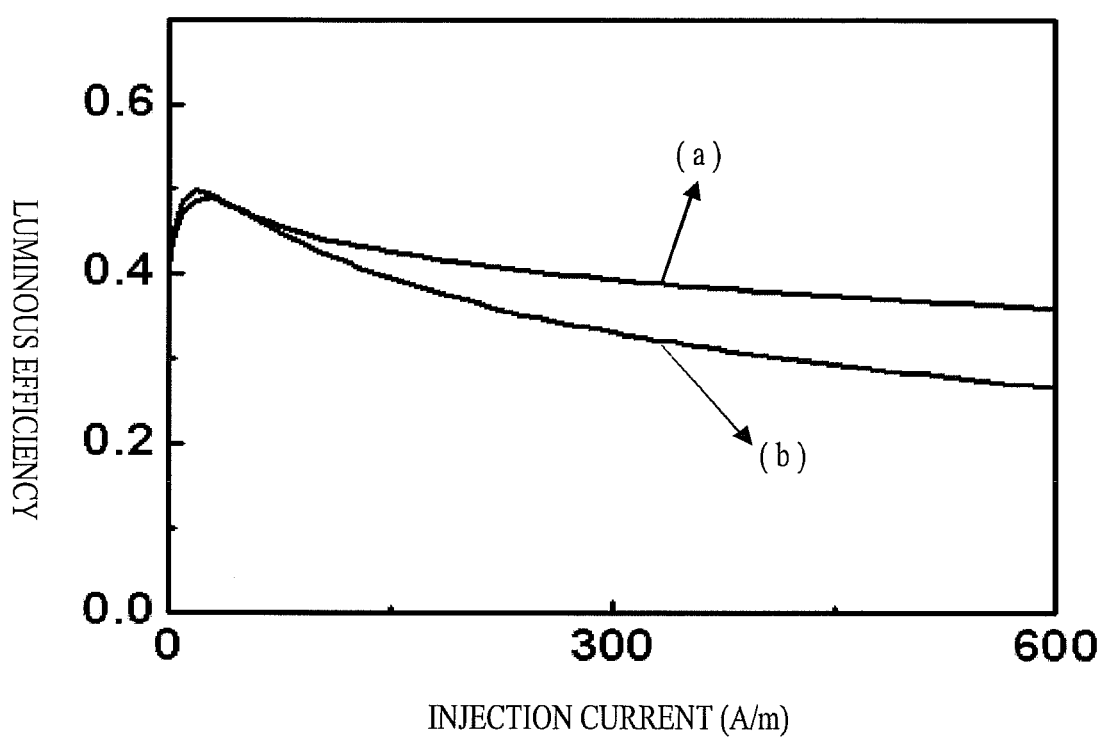
FIG. 9 is a graph illustrating luminous efficiencies of the light emitting device in accordance with the embodiment and the conventional light emitting device according to injection current.

FIG. 9 is a graph illustrating luminous efficiencies of the light emitting device in accordance with the embodiment and the conventional light emitting device according to injection current. It is understood that luminous efficiency of the light emitting device in accordance with the embodiment is improved by 35% at injection current of 600 A/m as compared to the conventional light emitting device.

Figure 10:
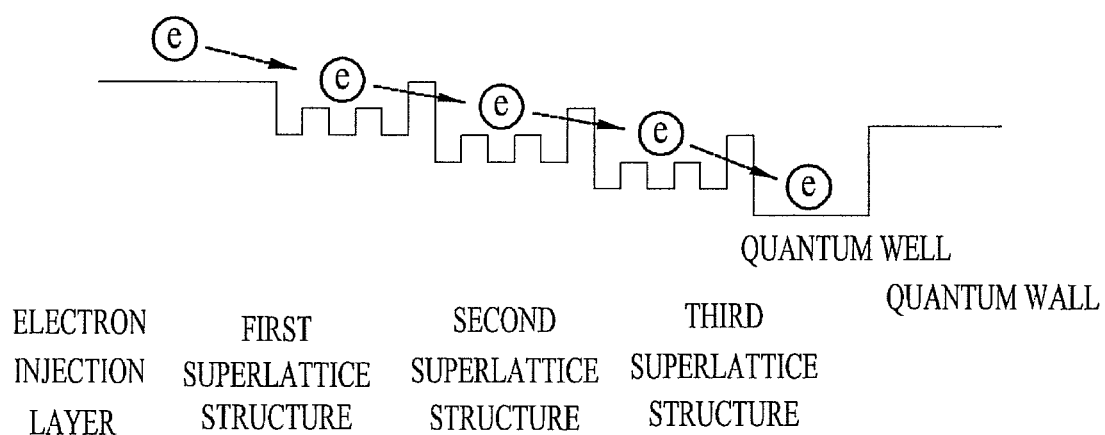
FIGS. 10 to 12 are views illustrating energy band gaps of light emitting devices in accordance with other embodiments.
Figure 11:
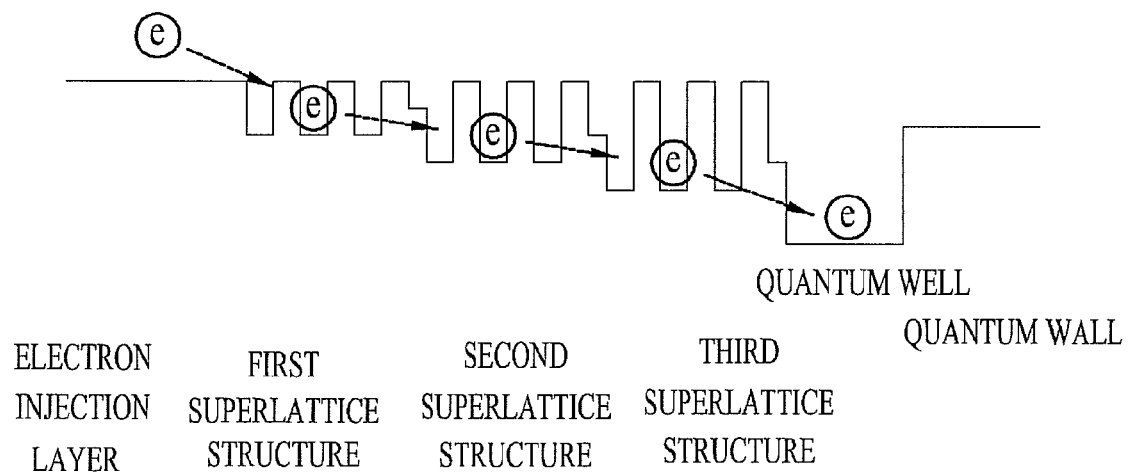
Figure 12:
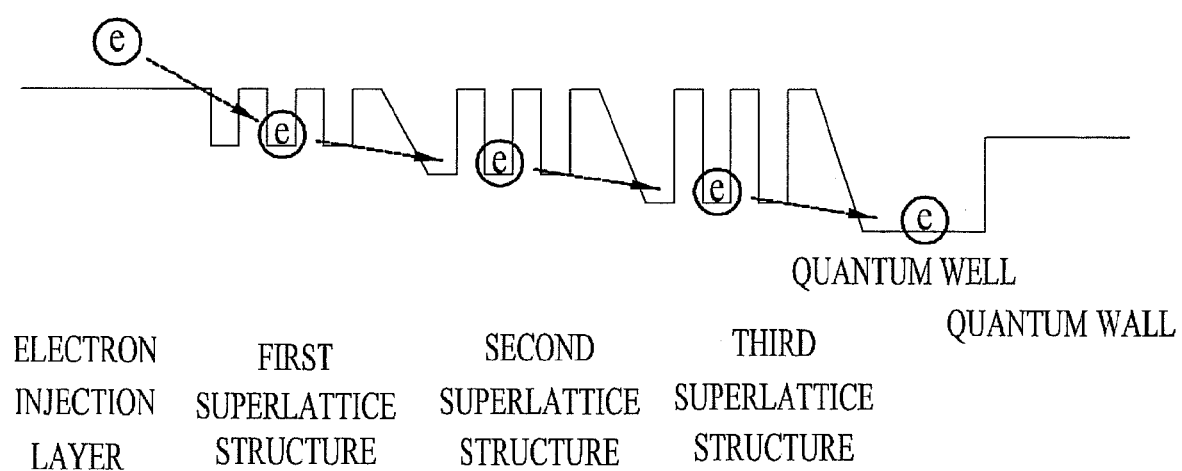

FIGS. 10 to 12 are views illustrating energy band gaps of light emitting devices in accordance with other embodiments.

With reference to FIG. 10, the energy band gaps of quantum well forming the boundary between the respective superlattice structures (first, second and third superlattice structures) are decreased in the direction toward the active layer. That is, the energy band gap of the quantum wall forming of the boundary between the second and third superlattice structures is smaller than the energy band gap of the quantum wall forming the boundary between the first and second superlattice structures. Further, the energy band gap of the quantum wall forming of the boundary between the third superlattice structure and the active layer is smaller than the energy band gap of the quantum wall forming the boundary between the second and third superlattice structures.

The above-described energy band gaps allow electrons injected from the electron injection layer to easily progress in the direction toward the active layer.

With reference to FIG. 10, the energy band gap of a layer having a large energy band gap in each of the superlattice structures is smaller than the energy band gap of the quantum wall forming the boundary between the corresponding superlattice structure and the neighboring superlattice structure. Such an energy band gap may be formed by the In content of a layer having a small In content in each of the superlattice structures which is greater than the In content of the quantum wall between the above superlattice structures. Therefore, electrons may easily move in one superlattice structure and thus be uniformly distributed.

With reference to FIG. 11, energy band gaps of quantum wells between the respective superlattice structures are decreased stepwise. Here, the energy band gaps are decreased in the direction toward the active layer. Such a configuration of the energy band gaps may be formed by increase In contents of the quantum walls between the superlattice structures stepwise in the direction toward the active layer.

Although the earlier embodiments illustrate that the energy band of the quantum wall between the superlattice structures is decreased vertically or nearly vertically up to the energy band of the neighboring superlattice structure in the superlattice structure, this embodiment differs from the earlier embodiments in that the energy band of the quantum wall forming the boundary between the superlattice structures is decreased stepwise. Here, although FIG. 11 illustrates that the quantum wall exhibits a stepwise energy band having one step, and the quantum wall may have a stepwise energy band having two or more steps.

With reference to FIG. 12, energy band gaps of quantum wells between the respective superlattice structures are decreased at inclinations in the direction toward the active layer. Although the embodiment shown in FIG. 11 illustrates that the energy band gaps of the quantum walls between the superlattice structures are decreased stepwise, this embodiment differs from the earlier embodiment in that the energy band gaps of the quantum walls between the superlattice structures are decreased at inclinations. Such an energy band gap may be formed by the In content of the quantum wall forming the boundary between the superlattice structures which is increased at an inclination in the direction toward the active layer.

In the embodiments shown in FIGS. 11 and 12, the energy band gaps of the quantum walls forming the boundaries between the superlattice structures may facilitate movement of electrons in the direction toward the active layer, and reduce movement of electrons in the opposite direction (i.e., in the direction toward the electron injection layer).

Figure 13:
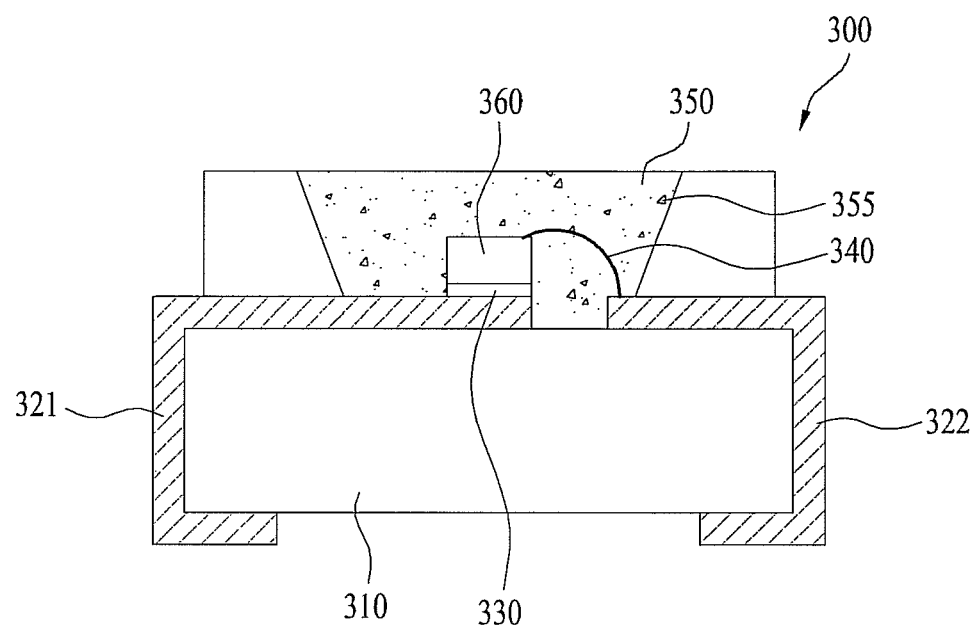
FIG. 13 is a sectional view of a light emitting device package in accordance with one embodiment.

FIG. 13 is a sectional view of a light emitting device package in accordance with one embodiment.

A light emitting device package 300 in accordance with this embodiment includes a package body 310, a first lead frame 321 and a second lead frame 322 installed on the package body 310, a light emitting device 360 installed on the package body 310 and electrically connected to the first lead frame 321 and the second lead frame 322, and a molding part 350 covering the external surface or the side surfaces of the light emitting device 360.

The package body 310 may include a material, such as silicon, synthetic resin or metal. The package body 310 includes inclined planes around the light emitting device 360, thus increasing light extraction efficiency.

The first lead frame 321 and the second lead frame 322 are electrically isolated from each other, and provide power to the light emitting device 360. Further, the first lead frame 321 and the second lead frame 322 may serve to reflect light generated by the light emitting device 360 to increase luminous efficiency, and serve to discharge heat generated by the light emitting device 360 to the outside.

The light emitting device 360 may be installed on the package body 310, or be installed on the first lead frame 321 or the second lead frame 322. The light emitting device 360 may be electrically connected to the first lead frame 321 and the second lead frame 322 by one out of a wire-bonding method, a flip chip-bonding method or a die-bonding method. In this embodiment, the light emitting device 360 is connected to the first lead frame 321 through a conductive adhesive layer 330 and is bonded to the second lead frame 322 through a wire 340.

The molding part 350 may surround the light emitting device 360 to protect the light emitting device 360. Further, the molding part 350 may include a phosphor 355, thus varying a wavelength of light emitted from the light emitting device 360.

The above light emitting device package 300 may include one light emitting device or plural light emitting devices from among the light emitting devices in accordance with the above-described embodiments, but is not limited thereto.

An array of a plurality of light emitting device packages in accordance with this embodiment may be mounted on a substrate, and optical members, such as a light guide panel, a prism sheet, a diffusion sheet, etc., may be disposed on an optical path of the light emitting device packages. The light emitting device packages, the substrate and the optical members may function as a light unit. In accordance with another embodiment, the light emitting devices or the light emitting device package in accordance with the above-described embodiments may constitute a display apparatus, an indicating apparatus or a lighting system, and, for example, the lighting system may include a lamp or a streetlight. Hereinafter, a head lamp or a backlight unit will be described, as examples of the lighting system with the above-described light emitting device packages.

Figure 14:
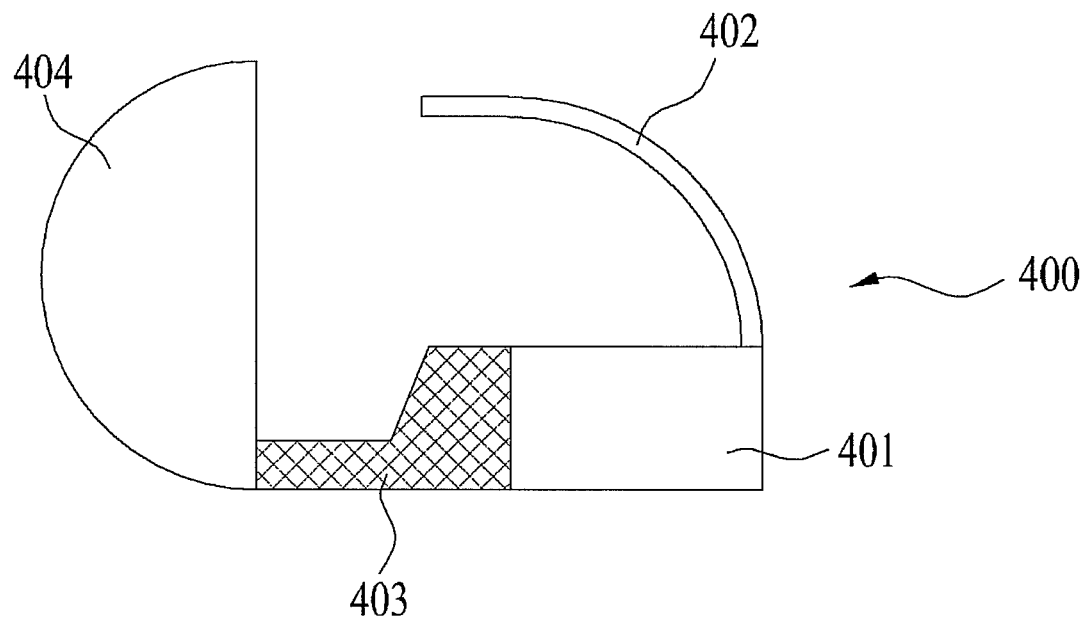
FIG. 14 is a view illustrating a head lamp having light emitting device packages in accordance with one embodiment.

FIG. 14 is a view illustrating a head lamp having light emitting device packages in accordance with one embodiment.

In a head lamp 400 in accordance with this embodiment, light emitted by a light emitting device module 401 is reflected by a reflector 402 and a shade 403, and then penetrates a lens 404, thereby traveling to a region in front of a vehicle.

Although not shown in the drawings, a circuit board may be disposed to supply current to the light emitting device module 401 within the head lamp 400.

A light emitting device package of the light emitting device module 401 may include a plurality of light emitting devices, but is not limited thereto.

Figure 15:
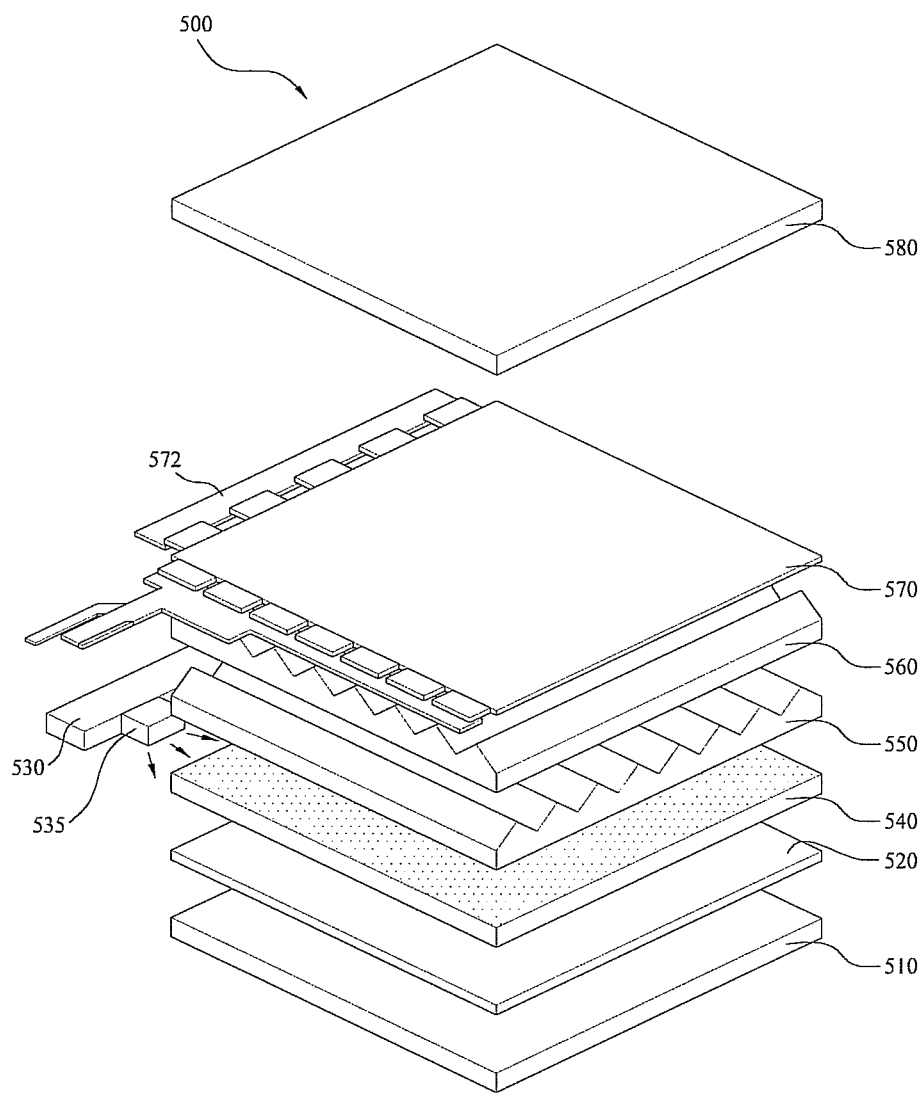
FIG. 15 is a view illustrating a display apparatus having light emitting device packages in accordance with one embodiment.

FIG. 15 is a view illustrating a display apparatus having light emitting device packages in accordance with one embodiment.

As shown in FIG. 15, a display apparatus 500 in accordance with this embodiment includes a light source module, a reflective plate 520 disposed on a bottom cover 510, a light guide panel 540 disposed in front of the reflective plate 520 to guide light emitted from the light source module to the front part of the display apparatus 500, a first prism sheet 550 and a second prism sheet 540 disposed in front of the light guide panel 540, a panel 570 disposed in front of the second prism sheet 560, and a color filter 580 disposed in front of the panel 570.

The light source module includes light emitting device packages 535 disposed on a circuit board 530. Here, a PCB may be used as the circuit board 530, and the light emitting device package 535 described with reference to FIG. 13 may be used.

The bottom cover 510 may accommodate components within the display apparatus 500. The reflective plate 520 may be provided as a separate component, as shown in FIG. 15, or be provided by coating the rear surface of the light guide panel 540 or the front surface of the bottom cover 510 with a material having high reflectivity.

The reflective plate 520 may include a material having high reflectivity and usable in an ultra-thin manner, such as polyethylene terephthalate (PET).

The light guide panel 540 scatters light emitted from the light emitting device package module so as to uniformly distribute the light throughout the entirety of a screen of the liquid crystal display apparatus. Therefore, the light guide panel 540 includes a material having a high index of refraction and high transmittance, such as polymethylmethacrylate (PMMA), polycarbonate (PC) or polyethylene (PE). Further, if the light guide panel 540 is omitted, an air guide-type display apparatus may be implemented.

The first prism sheet 550 includes a light transmitting and elastic polymer on one surface of a support film, and the polymer may has a prism layer in which plural three-dimensional structures are repeated. Here, such plural patterns may be disposed in a strip manner in which ridges and valleys are repeated, as shown in FIG. 15.

A direction of ridges and valleys formed on one surface of a support film of the second prism sheet 560 may be perpendicular to a direction of the ridges and the valleys formed on one surface of the support film of the first prism sheet 550.

This serves to uniformly distribute light transmitted from the light source module and the reflective plate 520 in all directions of the panel 570.

Although this embodiment illustrates optical sheets as including the first prism sheet 550 and the second prism sheet 560, the optical sheets may include another combination, for example, a micro lens array, a combination of a diffusion sheet and a lens array, or a combination of one prism sheet and a lens array.

As the panel 570, a liquid crystal display panel may be provided, or other kinds of display apparatuses requiring a light source may be provided instead of the liquid crystal display panel.

The panel 570 has a structure in which a liquid crystal layer is located between both glass bodies and polarizing plates are respectively mounted on the glass bodies to utilize polarization of light. Here, the liquid crystal layer has intermediate properties between a liquid and a solid in which organic molecules having fluidity like a liquid, i.e., liquid crystals, are regularly arranged, and displays an image using change of molecular arrangement by an external electric field.

The liquid crystal display panel used in the display apparatus is disposed as an active matrix, and thus uses transistors as switches adjusting voltage supplied to respective pixels.

The color filter 580 is provided on the front surface of the panel 570. The color filter 580 transmits only red, green and blue light from among light projected by the panel 570 to display an image may be displayed.

As is apparent from the above description, a light emitting device in accordance with one embodiment has improved luminous efficiency.

Although embodiments have been described with reference to a number of illustrative embodiments, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
a first conductivity-type semiconductor layer;
an interfacial layer including at least two superlattice structures adjacent to the first conductivity-type semiconductor layer;
an active layer adjacent to the interfacial layer; and
a second conductivity-type semiconductor layer adjacent to the active layer, wherein:
the first conductivity-type semiconductor layer, the interfacial layer, the active layer, and the second conductivity-type semiconductor layer are stacked in a same direction,
the first and second semiconductor layer are of different conductivity types,
wherein each superlattice structure has at least a first layer, a second layer and a third layer disposed between the first layer and the second layer, the first layer and the second layer are repeated at least twice,
wherein an energy band gap of the superlattice structure adjacent to the active layer is smaller than an energy band gap of the superlattice structure adjacent to the first conductivity-type semiconductor layer, and wherein a quantum wall forms a boundary between a first superlattice structure and a second superlattice structure, an energy band gap of the first layer in the first superlattice structure is same as an energy band gap of the second layer in the first superlattice structure, an energy band gap of the first layer in the second superlattice structure is same as an energy band gap of the second layer in the second superlattice structure, and the energy band gap of the first layer in the first superlattice structure is higher than the energy band gap of the first layer in the second superlattice structure, and wherein the first superlattice structure and the second superlattice structure are disposed between the first conductivity-type semiconductor layer and the active layer, wherein an energy band gap of the third layer is higher than the energy band gap of the first layer and the energy band gap of the second layer in each superlattice structure, and wherein an energy band gap of the third layer is smaller than an energy band gap of adjacent quantum walls.

2. The light emitting device according to claim 1, wherein the interfacial layer includes two to ten superlattice structures.

3. The light emitting device according to claim 1, wherein an energy band gap of a quantum wall forming the boundary between the superlattice structures is decreased at an inclination in the direction toward the active layer.

4. The light emitting device according to claim 1, wherein an energy band gap of a layer having the greatest energy band gap in each of the superlattice structures is smaller than an energy band gap of a quantum wall between the superlattice structures.

5. The light emitting device according to claim 1, wherein the energy band gap of the superlattice structure adjacent to the first conductivity-type semiconductor layer is smaller than or equal to an energy band gap of the first conductivity-type semiconductor layer.

6. The light emitting device according to claim 1, wherein the energy band gap of the superlattice structure adjacent to the active layer is greater than or equal to an energy band gap of the active layer.

7. A light emitting device comprising:
a first conductivity-type semiconductor layer;
an interfacial layer including at least two superlattice structures adjacent to the first conductivity-type semiconductor layer;
an active layer adjacent to the interfacial layer; and
a second conductivity-type semiconductor layer adjacent to the active layer, wherein:
the first conductivity-type semiconductor layer, the interfacial layer, the active layer, and the second conductivity-type semiconductor layer are stacked in a same direction,
the first and second semiconductor layer are of different conductivity types,
wherein each superlattice structure has at least a first layer, a second layer and a third layer disposed between the first layer and the second layer, the first layer and the second layer are repeated at least twice, and
wherein an In content of the superlattice structure adjacent to the active layer is greater than an In content of the superlattice structure adjacent to the first conductivity-type semiconductor layer,
wherein a quantum wall forms a boundary between a first superlattice structure and a second superlattice structure, an In content of the first layer in the first superlattice structure is same as an In content of the second layer in the first superlattice structure, an In content of the first layer in the second superlattice structure is same as an In content of the second layer in the second superlattice structure, and the In content of the first layer in the first superlattice structure is smaller than the In content of the first layer in the second superlattice structure, and wherein the first superlattice structure and the second superlattice structure are disposed between the first conductivity-type semiconductor layer and the active layer, wherein an energy band gap of the third layer is higher than the energy band gap of the first layer and the energy band gap of the second layer in each superlattice structure, and wherein an energy band gap of the third layer is smaller than an energy band gap of adjacent quantum walls.

8. The light emitting device according to claim 7, wherein the In contents of the superlattice structures are increased in a direction toward the active layer.

9. The light emitting device according to claim 7, wherein the superlattice structures have a composition formula of $Al_x In_y Ga_{1-x-y} N$ (here, $0 \leq x, y \leq 1$).

10. The light emitting device according to claim 7, wherein an In content of a quantum wall forming a boundary between the superlattice structures is increased at an inclination in a direction toward the active layer.

11. The light emitting device according to claim 7, wherein an In content of a layer having the smallest In content in each of the superlattice structures is greater than an In content of a quantum wall between the superlattice structures.

12. The light emitting device according to claim 10, wherein the In content of the superlattice structure adjacent to the first conductivity-type semiconductor layer is greater than or equal to an In content of the first conductivity-type semiconductor layer.

13. The light emitting device according to claim 7, wherein the In content of the superlattice structure adjacent to the active layer is smaller than or equal to an In content of the active layer.

14. The light emitting device according to claim 1, wherein the energy band gap of the quantum wall between the first superlattice structure and the second superlattice structure is decreased stepwise in a direction toward the active layer.

15. The light emitting device according to claim 1, wherein the energy band gap of the quantum wall between the first superlattice structure and the second superlattice structure is decreased at inclinations in a direction toward the active layer and is decreased at vertically in a direction toward the first conductivity-type semiconductor layer.

16. The light emitting device according to claim 7, wherein the In content of the quantum wall between the first superlattice structure and the second superlattice structure is increased stepwise in a direction toward the active layer.

17. The light emitting device according to claim 7, wherein the In content of the quantum wall between the first superlattice structure and the second superlattice structure is increased at inclinations in a direction toward the active layer and is increased at vertically in a direction toward the first conductivity-type semiconductor layer.

18. The light emitting device according to claim 7, wherein an In content of the third layer is lower than the In content of the first layer in each superlattice structure, and the In content of the third layer is lower than the In content of the second layer in each superlattice structure.

* * * * *